United States Patent [19]

Koehler

[11] 4,281,041
[45] Jul. 28, 1981

[54] HARD SOLDERABLE METAL LAYERS ON CERAMIC

[75] Inventor: Wolfgang Koehler, Alzenau, Fed. Rep. of Germany

[73] Assignee: Degussa Aktiengesellschaft, Frankfurt, Fed. Rep. of Germany

[21] Appl. No.: 122,053

[22] Filed: Feb. 15, 1980

[30] Foreign Application Priority Data

Feb. 22, 1979 [DE] Fed. Rep. of Germany ....... 2906888

[51] Int. Cl.$^3$ .......................... B32B 9/00; B32B 9/06; B32B 15/04
[52] U.S. Cl. ................. 428/336; 204/192 C; 427/250; 427/255; 427/299; 427/404; 428/450; 428/457; 428/469; 428/472
[58] Field of Search ............. 427/250, 255, 404, 299, 427/125, 39; 428/336, 450, 457, 469, 472, 538, 539, 432, 433; 204/192 C; 75/172 R

[56] References Cited

U.S. PATENT DOCUMENTS

| 2,757,104 | 7/1956 | Howes | 427/125 |
| 2,799,600 | 7/1957 | Scott | 427/404 |
| 3,629,776 | 12/1971 | Watano | 427/125 |
| 3,833,410 | 9/1974 | Ang et al. | 428/450 |
| 4,046,712 | 9/1977 | Cairns et al. | 204/192 C |
| 4,068,022 | 1/1978 | Glick | 427/125 |

FOREIGN PATENT DOCUMENTS

| 1533234 | 6/1970 | Fed. Rep. of Germany | 75/172 R |
| 2523971 | 12/1976 | Fed. Rep. of Germany | 75/172 R |

Primary Examiner—Ronald H. Smith
Assistant Examiner—S. L. Childs
Attorney, Agent, or Firm—Cushman, Darby & Cushman

[57] ABSTRACT

In order to produce hard solderable metal coatings on a ceramic there is applied to the ceramic base a thin layer of a palladium alloy containing 20–70% of cobalt and/or iron. The coating is preferably applied by vapor deposition or sputtering. The adhesiveness of the coatings is still further improved if there is added to the alloy 3–20% of chromium, manganese and/or titanium.

17 Claims, No Drawings

HARD SOLDERABLE METAL LAYERS ON CERAMIC

BACKGROUND OF THE INVENTION

The invention is directed to a process for the production of hard solderable and good adhering metal coatings on ceramic parts by applying a palladium containing alloy and to the resulting compositions.

It is known to produce solderable coatings on ceramic bases by applying metal containing baked on pastes. The adhesion of such layers to the ceramic base, however, in many cases is not sufficient. Besides these coatings for the most part are only solderable with silver containing soft solders, but not with hard solders.

Furthermore, the vapor deposition or sputtering of nickel or nickel alloy coatings with iron or chromium is known for making ceramic parts solderable. In practice, however, it has been found that these nickel superimposed layers are attacked by the hard solders used and dissolved. Palladium-nickel alloys have also been proposed for these purposes. However, because of the toxic properties of nickel, nickel and nickel alloys are undesired as vapor deposition or sputter coatings.

Therefore it was the problem of the present invention to find a process for the production of solderable metal coatings on ceramic bases which are resistant to hard solders, have good adhesion to the base and above all are non-toxic.

SUMMARY OF THE INVENTION

This problem was solved according to the invention by applying to the ceramic base a coating of a palladium alloy containing 20 to 70 weight percent cobalt and/or iron. Especially recommended are alloys containing 30 to 60 weight percent cobalt and/or iron. The thickness of the coating layer normally is 0.2-5$\mu$. The invention also includes coated ceramic products.

Surprisingly such alloy coatings show a good adhesion to the ceramic base and already at a layer thickness of 1 to 2$\mu$ are hard solderable without problem, without the coating being dissolved by the hard solder usable. Especially good adhering and hard solder resistance coatings are obtained if there are added to the palladium-cobalt alloys or palladium-iron alloys additionally a total of 3 to 20 weight percent of chromium and/or manganese and/or titanium.

Advantageously the alloy coatings of the invention are applied to the ceramic bases by vapor deposition in a vacuum or by sputtering. A great advantage in using the palladium alloys of the invention is their relatively low melting point. A palladium alloy with 40% cobalt for example melts at around 1220° C. In high vacuum deposition for example there is employed a pressure of about $1 \times 10^{-5}$ Torr, at which the vapor pressure of cobalt and palladium are approximately equal and the boiling points are about 1160° C. This has the great advantage that the alloys of the invention are very quickly vaporized from the melt, for the pure metals sublime at this pressure. The adhesion of of the alloys of the invention to the ceramic base is very good because of the quick vaporization from the melt and better than that of pure metal components.

The addition of 3 to 20 weight percent of chromium and/or manganese and/or titanium improves the adhesiveness of the vapor deposited alloy coatings. For example there can be used for this purpose an alloy of 50 weight percent palladium, 40 weight percent cobalt and 10 weight percent chromium. Of course the chromium can also be applied first to the ceramic base as an adhesion facilitator in a thin layer from a separate vaporizer.

A very good adhesion and hard solderability is also shown by palladium-cobalt or palladium-iron alloy coatings which are applied to ceramic bases by a sputtering process. For example for this purpose there is used a palladium alloy containing 50 weight percent cobalt. In the sputtering process it is particularly advantageous for the adhesiveness of the applied palladium alloy coating if there is previously sputtered a thin titanium or chromium layer on the ceramic base.

A better adhesion of the superimposed layer on the ceramic surface is produced by a previous ion bombardment (glow discharge, sputter etching), through which monomolecular water films present on the surfaces are carried off and the bases are even easily roughened.

A further advantage of the palladium alloy coatings is their good resistance to scratching which is far higher than that of the individual components. It is even resistant to abrasion with fine steel wool. Therefore the finished metallized ceramic part can be stored without special precautions.

The process of the invention is usable with all ceramic work materials such as for example aluminum oxide, magnesium oxide, silicon nitride or tungsten carbide. As hard solders there can be used all of the conventional hard solders.

Unless otherwise indicated all parts and percentages are by weight.

The process can comprise, consist essentially of or consist of the steps set forth and the compositions can comprise, consist essentially of or consist of those set forth.

The following examples further illustrate the process and product of the invention.

DESCRIPTION OF THE PREFERRED EMBODIMENTS

EXAMPLE 1

Flat ceramic parts were mounted in a high vacuum vapor deposition apparatus of conventional construction on a rotating plate in a vertical distance from a vaporizer of about 200 mm. Besides there was located in the container a glow electrode for carrying out a glow discharge. In the vaporizer (tungsten-boat) there was placed a piece of a palladium alloy made of 46 weight percent Pd, 46 weight percent Co and 8 weight percent chromium. The kettle was first evacuated to a pressure of $8 \times 10^{-2}$ Torr, then the glow discharge fired, whereby the rotating plate rotated. The ceramic surface was preliminarily purified by the glow discharge (5 minutes). Subsequently the container was evacuated to a pressure of $5 \times 10^{-5}$ Torr, the tungsten vaporizer was next heated to 1100° C. through direct passage of current (resistance heating) and left at this temperature for about 2 minutes. Hereby the chromium provided as an intermediate adhesive sublimed and deposited on the ceramic parts fastened to the rotating plate. Subsequently the vaporizer temperature was increased to about 1250° to 1300° C., so that the alloy melted and vaporized very quickly. The thickness of the layer of the vapor deposited alloy was about 2.5$\mu$.

EXAMPLE 2

Small plates of aluminum oxide were placed on the substrate plate in a commercial sputtering apparatus (diode system). The container was first evacuated to a pressure of about 1×10⁻⁵ Torr. Subsequently with flowing argon there was established a pressure of 1×10⁻² Torr, and the oxide plates were etched clean from impurities on the surface through a glow discharge (sputter-etching) for 10 minutes. Subsequently at the same pressure under a chromium target (at an interval of about 35 mm) there was carried out the deposition of an about 0.1μ thick chromium layer as an adhesive intermediate. The plate with the small oxide plates at the conclusion was turned under the target made of Pd 50 weight percent iron alloy and provided here with a PdFe coating about 1μ thick. The sputtering rate was about 400 A/min at a sputtering output of 4 W/cm² (target diameter 100 mm).

Both the vapor deposited and the sputtered parts permitted the soldering with commercial silver hard solders, e.g. 72% Ag, 28% Cu or 30% Ag, 28% Cu, 21% Zn and 21% Cd, to iron sheets without difficulty. The best results were produced with supports whose coefficient of expansion was adjusted to that of the ceramic.

As comparison there were also carried out experiments with previously described vapor deposited or sputtered pure nickel layers. The hard solders dissolved the nickel coating so that these samples did not permit trouble free soldering.

The entire disclosure of German priority application P 29 06 888.0 is hereby incorporated by reference.

What is claimed is:

1. A product suitable for applying hard solder comprising a ceramic base and a coating on the surface thereof of an alloy consisting essentially of (1) palladium with 20 to 70 weight percent of a member of the group consisting of cobalt, iron and a mixture of cobalt and iron or (2) an alloy containing (1) and an additionally 3 to 20 weight percent of a member of the group consisting of chromium, manganese, titanium and mixtures thereof.

2. A product according to claim 1 wherein the coating has a thickness of 0.2 to 5μ.

3. A product according to claim 2 wherein the alloy contains 30 to 60% of cobalt, iron or a mixture of cobalt and iron.

4. A product according to claim 1 wherein the alloy is a palladium-cobalt alloy.

5. A product according to claim 1 wherein the alloy is a palladium-iron alloy.

6. A product according to claim 1 wherein the alloy additionally contains 3 to 20 weight percent of a member of the group consisting of chromium, manganese, titanium and mixtures thereof.

7. A product according to claim 6 wherein the alloy contains 50 weight percent palladium, 40 weight percent cobalt and 10 weight percent chromium.

8. A product according to claim 6 wherein the alloy contains 46 weight percent palladium, 46 weight percent cobalt and 8 weight percent chromium.

9. A product according to claim 1 comprising the ceramic base, adhered to said base a layer of chromium and adhered to the chromium an alloy of palladium with cobalt, iron or a mixture thereof.

10. A product according to claim 1 comprising the ceramic base, adhered to said base a layer of chromium or titanium and adhered to the chromium or titanium the alloy of palladium with cobalt, iron or a mixture thereof.

11. A product according to claim 1 having hard solder applied to the alloy coating.

12. The product of claim 6 wherein the alloy layer is applied by vapor deposition in a vacuum or sputtering.

13. A product according to claim 1 wherein the alloy layer is applied by vapor deposition or sputtering.

14. A product according to claim 13 wherein the alloy is applied by vapor deposition.

15. A product according to claim 13 wherein the alloy is applied by sputtering.

16. A product according to claim 9 wherein the chromium layer has been applied by sputtering the chromium to the ceramic base before applying the alloy.

17. A product according to claim 9 wherein the chromium layer has been applied by vapor deposition to the ceramic base before applying the alloy.

* * * * *